United States Patent [19]

Sonderegger et al.

[11] Patent Number: 4,503,351
[45] Date of Patent: Mar. 5, 1985

[54] PIEZOELECTRIC ELEMENT FOR INCORPORATION IN PRESSURE, FORCE OR ACCELERATION TRANSDUCERS

[75] Inventors: Conrad Sonderegger; Hans C. Sonderegger, both of Neftenbach; Werner Boltshauser, Winterthur, all of Switzerland

[73] Assignee: Kistler Instrumente A.G., Winterthur, Switzerland

[21] Appl. No.: 85,544

[22] Filed: Oct. 17, 1979

[30] Foreign Application Priority Data

Feb. 20, 1979 [DE] Fed. Rep. of Germany ....... 2906407

[51] Int. Cl.³ .............................................. H01L 41/08
[52] U.S. Cl. .................................. 310/329; 310/333; 310/338
[58] Field of Search ....................... 310/329, 333, 338; 73/517 R, 517 A, DIG. 4, 700, 708, 715, 723, 724, 744, 745, 753, 754

[56] References Cited

U.S. PATENT DOCUMENTS

| | | |
|---|---|---|
| 2,824,243 | 2/1958 | Sargeant ................................ 310/329 |
| 3,104,334 | 9/1963 | Bradley, Jr. et al. ........... 310/333 X |
| 3,725,986 | 4/1973 | Hoogenboom . |
| 3,727,084 | 4/1973 | Epstein ............................ 310/333 X |
| 3,743,869 | 7/1973 | Hugli ............................... 310/329 X |
| 3,749,948 | 7/1973 | Morris ............................. 310/338 X |
| 4,180,892 | 1/1980 | Jensen ............................. 310/333 X |
| 4,211,951 | 7/1980 | Jensen ............................. 310/333 X |

Primary Examiner—Mark O. Budd
Attorney, Agent, or Firm—Craig & Burns

[57] ABSTRACT

A piezoelectric element for incorporation in pressure, force or acceleration transducers, in which at least two piezoelectric flat plates loaded in shear mode are arranged on both sides of a central support and are retained under compressive pre-tension by pressure distribution members bearing externally on the piezoelectric plates; a compression form member provided with a location hole for the support, the piezoelectric plates and the pressure distribution members is fitted over the pressure distribution members by direct or indirect shrinking the pressure distribution members are preferably made of two exact fitting cylindrical segments transmitting the tension forces evenly over the piezoelectric plates.

17 Claims, 7 Drawing Figures

PIEZOELECTRIC ELEMENT FOR INCORPORATION IN PRESSURE, FORCE OR ACCELERATION TRANSDUCERS

The present invention relates to a piezoelectric element for incorporation in pressure, force or acceleration transducers, with at least two flat piezoelectric plates loaded in shear mode, which are arranged on both sides of a central support and are retained under compressive pre-tension by two pressure distribution members bearing on the piezoelectric plates.

In measurement engineering, piezoelectric elements have been used successfully for decades for measuring mechanical vibrations, forces and pressures, i.e., for measuring mechanical quantities. For this, the piezoelectric elements are incorporated in acceleration or vibration or force or pressure transducer housing which are generally completely closed-off. These measurement instruments are provided with suitable mounting members, surfaces for introducing the forces and membranes on which the pressure acts, as well as with connections for transmitting the measurement signal, so that they have completely different external shapes according to the purpose for which they are intended. However, in all cases it is important that the piezoelectric element has the same task, namely of converting a mechanical force into a proportional electrical signal. In particular, attempts have been made repeatedly to create a standard piezoelectric element which can be used for incorporation in all transducers for measuring mechanical quantities, but these attempts have hitherto not produced a piezoelectric element for a transducer which can be used universally, which can be mass-produced and which can be used for all of the aforementioned measurement instruments without considerable modifications.

Thus, various piezoelectric transducer systems have become known, in particular for measuring acceleration, which operate according to the shear principle. The arrangement according to German Offenlegungsschrift No. 27 12 359 comprises two rectangular piezo plates loaded in shear, which are arranged on both sides of a flat central plate and bearing, respectively, on which is a mass member in the form of a segment of a circle, the arrangement being held together by a spring ring. However, the thin support allows only a poor connection of the piezoelectric system to a transducer base plate with correspondingly low inherent frequency. In addition, the circular spring ring, which is solely supported on the two segments, is too elastic to pre-tension the piezoelectric plates with a high contact pressure necessary for the transmission of high shearing forces, in particular if a piezoelectric element constructed in this way is intended to be used at relatively high temperatures.

Transducer systems are also known, in which the mass segments, the piezoelectric plates and the support are provided with a bore, through which a screw is guided, which places the entire system under mechanical pre-tension. Although an arrangement of this type has a very simple construction, it entails the drawback that the piezoelectric plates must be provided with bores, which substantially increases their susceptibility to cracks and also causes a danger of short-circuiting along the screw holes.

In contrast thereto, it is an object of the present invention to provide a piezoelectric element of the aforementioned type, which completely retains its ability to function, even at, or in particular at high operating temperatures, and can thus be produced with great accuracy in an economical manner and is also suitable for universal incorporation in pressure, force and acceleration transducers.

The present invention thus provides a piezoelectric element for a transducer which can be used universally and can be incorporated both in pressure, force as well as acceleration transducers and is particularly suitable for use at relatively high temperatures. Perfect non-deforming crystal layers and very high uniform tensioning of the crystals as far as possible along a single axis are prerequisites particularly at temperatures of, for example, 600° C. These requirements are met by two pressure distribution members in the form of semicircular segments, which act on the piezoelectric plates with a uniformly distributed specific surface tension of, for example, 30 kp/mm$^2$ or more, by means of a solid shrunk-on and stiff spring-shaped compression form member. Piezoelectric elements are thus produced which can be subjected to high thermal and mechanical stresses, which are clearly superior to cemented, soldered, or screwed-together arrangements or arrangements clamped by spring rings.

The invention also relates to the construction of measurement instruments equipped with the piezoelectric element according to the present invention as more fully described hereinafter.

These and other objects, features and advantages of the present invention will become more apparent from the following description when taken in conjunction with the accompanying drawing which shows, for purposes of illustration only, several embodiments in accordance with the present invention, and wherein.

In general, the present invention utilizes flat piezoelectric plates, i.e., plates machined flat since it has been found that flat piezoelectric plates and similarly machined contact surfaces are better suited for use at temperatures of more than 400° C.

Figure 1:
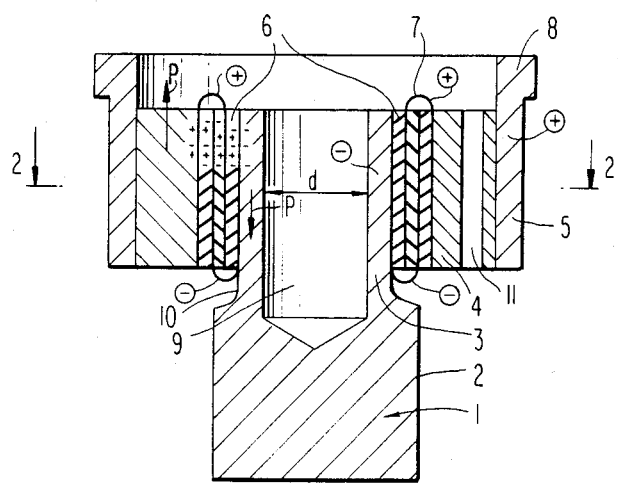
FIG. 1 is a longitudinal cross-sectional view of a piezoelectric element constructed according to the present invention, which is particularly suitable for incorporation in pressure transducers.
Figure 2:
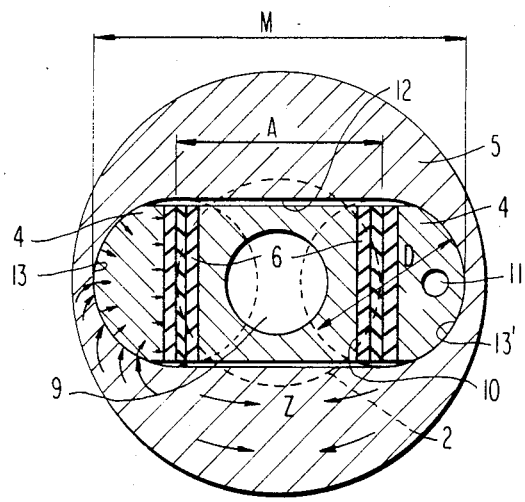
FIG. 2 is a transverse cross-sectional view taken along line 2—2 of FIG. 1.
Figure 3:
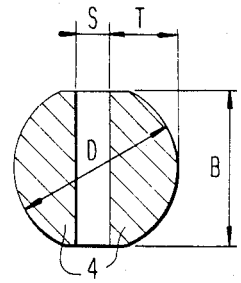
FIG. 3 is a cross-sectional view serving to illustrate the construction and manufacture of pressure distribution members of the present invention.

Referring now to the drawing wherein like reference numerals are used throughout the various views to designate like parts, the construction of a piezoelectric element according to the present invention is illustrated in FIGS. 1, 2 and 3. A mounting part generally designated by reference numeral 1 preferably consists of a temperature-resistant Ni-alloy, for example, Nimonic, and comprises a cylindrical press-fit piston 2. As shown, a rectangular support 3 for the piezoelectric plates, which includes two opposed ground flat parallel bearing surfaces 10, is formed on the press-fit piston 2, for example, by milling. The diameter d of a bore 9 provided in the center of the support 3 is of great significance for producing the necessary elasticity and for ensuring the desired consistency of shape of the bearing surfaces 10 under different temperature conditions. At least one flat parallel piezoelectric plate 6 bearing against a respective bearing surface 10 serves as the piezoelectric element, which plate, upon the application of an axial shearing stress P (FIG. 1) sends negative or positive charges to the piezoelectric support 3, in a known manner, according to the direction of the force P. In the example illustrated, three piezoelectric plates 6 are provided, between which electrodes 7 are inserted in a known manner. Normally, these electrodes are stamped out of thin metal foil and inserted at the time of assembly. However, in place of the metal foil, metal coatings can be applied directly to the piezoelectric plates 6. Experience has shown that the connecting methods adopted from semi-conductor technology, for use at high temperatures, are superior to inserted metal foils. Both piezo-ceramic as well as single crystals can be used as piezoelectric plates 6. Suitable single crystal materials are quartz crystal, tourmaline, lithium niobate, lithium tantalate and the like. The orientation of such crystal plates for axial shearing stress is known to a person skilled in the art. Therefore, it is not necessary to go into this in more detail.

As illustrated, the arrangement described above also comprises two pressure distribution members 4, which are preferably formed by severing a bolt with the diameter D, flattened according to FIG. 3, for example, by grinding at two diametrically opposed points, so that two substantially semi-circular segments 4 are produced. The diametral spacing of the two flattened areas has a suitable value B, which corresponds to the width of the piezoelectric plates 6. The bearing surfaces of the pressure distribution members 4 coming into contact with the piezoelectric plates 6 are also machined flat to a tolerance dimension T (FIG. 3). As shown in FIGS. 1 and 2, a pressure distribution member 4 of this type is preferably located on the side of the respective piezoelectric plate 6 remote from the support 3, so that the plate 6 is enclosed between two members 3 and 4. Advantageously, the pressure distribution members 4 are also provided with assembly bores 11 (only one is shown in FIG. 2), which make it possible to attach the piezoelectric plates 6 to the support 3 by way of the pressure distribution members 4, in which case a predetermined minimum pre-tension should be maintained. After this, the main dimension M which is important for the shrinkage operation to be described in detail hereinafter, can be taken on the arrangement pre-assembled in this way, along its relatively long main axis (FIG. 2).

As shown in FIGS. 1 and 2, a compression form member 5 of solid structure which is substantially stiff in its spring characteristics, is provided with a preferably circular cross section, which can likewise consist of a temperature-resistant alloy, such as Nimonic or Inconel. The compression form member 5 is provided with a slot 12 aligned centrally with respect to its main axes, having a central rectangular section A, with which sections 13, 13' in the form of circular segments are flush on each side. For this purpose, a circular pre-formed blank can be clamped on a coordinate drilling machine and two bores each with the diameter D (FIG. 3) can be drilled respectively along a main axis of the pre-formed blank with a center-to-center spacing A, whereupon the remaining web between the bores is milled out or eroded to a width corresponding to the dimension D. Groups of compression form members 5 which have different tolerance dimensions M according to FIG. 2 are thus produced.

As mentioned above, at the time of assembly, pre-assembled arrangements each consisting of a mounting part 1, piezoelectric plates 6 and pressure distribution members 4 are selected in groups with a similar main dimension M and thereafter pairs of the pre-assembled arrangements and compression form members 5 with the described matched allowance for shrinkage are set up. Then a respective compression form member 5 is heated and placed over the corresponding pre-assembled arrangement according to FIG. 2 and then cooled according to known methods of shrinkage techniques. After the equilization of temperature, a piezoelectric element is produced, which, as a result of the high surface pressure produced by the shrunk-on stiff spring-shaped compression form member 5, is able to transmit high shearing forces over a wide range of temperatures. As a result of the construction of the compression form member according to the invention, as described above, a symmetrical transmission of forces to the pressure distribution members 4 is achieved, which distribute the tensile forces Z resulting from the shrinkage process, uniformly onto the piezoelectric plates 6 and the piezoelectric support 3. The circle of forces is thus closed by the shortest route. For incorporation in pressure and force transducers, the compression form member 5 may advantageously be provided with an outer peripheral flange portion 8 (FIG. 1).

Figure 4:
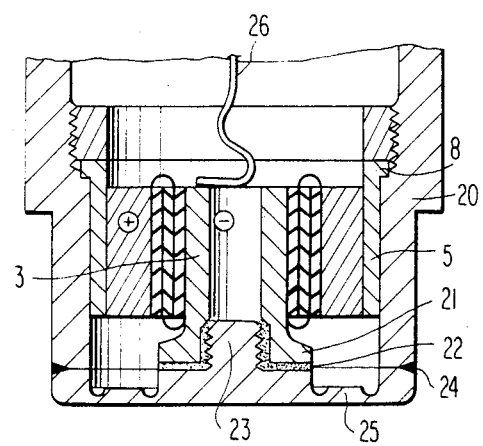
FIG. 4 is a longitudinal cross-sectional view through a preferred embodiment of a pressure transducer provided with a piezoelectric element according to the present invention.

FIG. 4 shows the incorporation of the piezoelectric element according to the present invention in a pressure transducer. The flange portion 8 of the compression form member 5 is thus clamped in known manner into the pressure transducer housing 20, for example, by a threaded ring screwed into the threaded bore. At its center, a membrane 25 which is attached or welded to one end of the housing 20 at 24, comprises a plunger 23, which is provided with an insulating layer 22 and is connected, for example, by a screw connection to the press-fit piston 2, which in this case is shortened and serves as a pressure transmission piston. Sprayed coatings of metal oxides, for example, $Al_2O_3$ or $MgO$, which are sprayed onto the respective metal surfaces according to known plasma or flame-spraying methods, are suitable as the insulation 22.

The transmission of a signal from the piezoelectric support 3 takes place by means of an electrode 26 which leads to a connecting plug which is not shown. A pressure transducer with a high inherent frequency results from the very rigid connection of the pressure transmission piston 2 to the compression form member 5.

Figure 5:
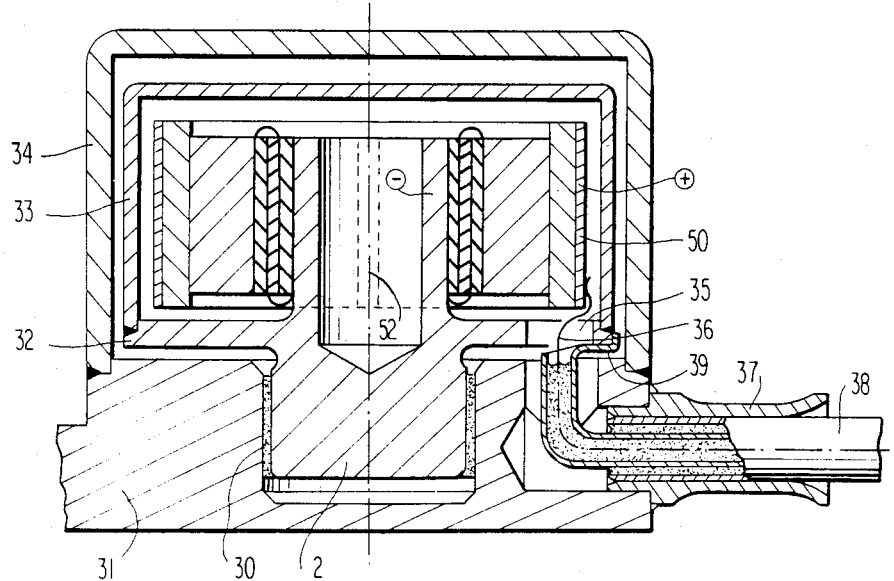
FIG. 5 is a longitudinal cross-sectional view through a preferred embodiment of an acceleration transducer with special shielding, provided with a modified piezoelectric element according to the present invention.
Figure 6:
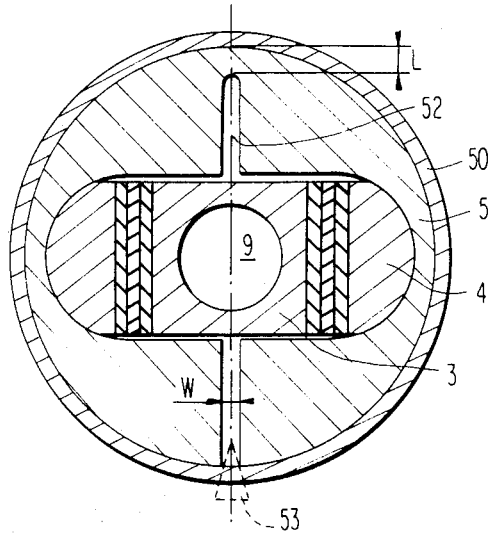
FIG. 6 is a transverse cross-sectional view taken along line 6—6 of FIG. 5.

FIG. 5 shows one application of a piezoelectric element according to the present invention in a fully shielded acceleration transducer whose base is insulated. Transducers of this type may be used, for example, for monitoring purposes in reactor plants, aeroplane and static turbines. FIG. 6 shows the piezoelectric element provided in FIG. 5, in outline.

According to FIGS. 5 and 6, the press-fit piston 2 of the piezoelectric element according to the invention is provided with an insulating layer 30 and is shrunk into the transducer housing 31 according to known methods. The insulating layer may be applied, as described above in conjunction with FIG. 4. After spraying-on the insulating layer 30, the press-fit piston 2 is ground to the shrinkage dimension. In contrast to the embodiment according to FIGS. 1 and 2, in this case, a shielding flange 32 extending horizontally outwards is formed on the mounting part in the region of the transition of the press-fit piston 2 to the piezoelectric support 3, to which shielding flange 32 a shielding hood 33 is attached, which completely covers the piezoelectric plates and associated parts towards the outside. Thus, the parts of the piezoelectric element carrying a charge are completely shielded with respect to the housing according to the principle of a Faraday cage. Magnetic and electrical fields as well as potential differences between the transducer housing and the housing of a signal processing device therefore have no effect on the measurement signal, so that transducers of this type can be installed in systems arranged close together, where large numbers of instrument leads and control leads are located side-by-side.

When using the piezoelectric element according to the present invention in acceleration transducers, the compression form member 5, which simultaneously represents the seismic mass, may advantageously consist of a heavy metal alloy with a specific weight of approximately 20, instead of Nimonic with a specific weight of approximately 8.0. Above all, heavy metal alloys of this type have the drawback that in relatively high temperature ranges, they can transmit high compressive forces, but only average tensile forces. Therefore, for applications operating at temperatures above 400° C., it is recommended to use a compression form member 5 according to FIG. 6 from a heavy metal alloy, a slot 52 also being introduced by milling at right-angles to the longitudinal direction of the slot in the compression form member 5, with a width W and up to a residual depth L. Pre-assembly of the mounting part 1 to the piezoelectric plates 6, electrodes 7 and pressure distribution members 4 can thus take place without additional assembly means, in that the slot 52 is opened somewhat with an assembly wedge 53, whereupon the compression form member 5 can be placed over the pressure distribution members 4. After checking the position of the piezoelectric plates and electrodes, the assembly wedge 53 is removed, whereupon the clamping effect holds the assembled unit together. After this, a suitable shrinkage ring 50, for example, consisting of Nimonic, is heated according to known methods of shrinkage technology and fitted by shrinkage. After this, the piezoelectric element is inserted into the transducer housing 31 once more according to known methods of shrinkage technology. After introducing a shielded signal cable 36 through a passage 35 in the flange 32 and connecting the signal cable 36 to the shrunk-on ring 50, the shielding hood 33 can be put into position. Then, the cable shield 39 is connected to the shielding hood 33, whereupon an outer housing cover 34 is welded to the housing 31. A metal cable 38 is necessary for connecting a transducer shielded in this way and whose base is insulated, which metal cable 38 is available on the market in various sizes. The prepared end of the cable is welded into a cable flange 37, which is in turn welded to the housing 31.

However, it will be understood that the piezoelectric element according to the present invention can also be incorporated in an acceleration transducer without insulation of its base. It is also possible to use a compression form member 5 without slit 52, as shown in FIG. 2. Suitable heavy metal alloys exist for temperature ranges of up to 400° C., whereas Ni alloys should be used as the mass above this temperature, which has the result that smaller measurement signals or larger pick-up volumes result.

Figure 7:
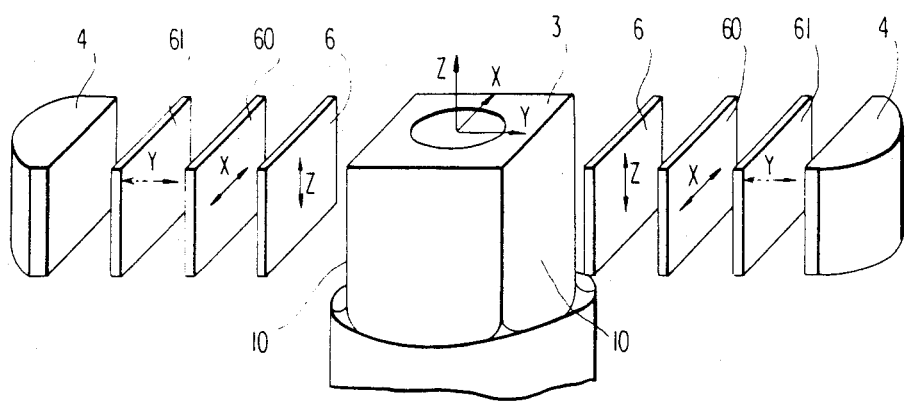
FIG. 7 is a perspective, exploded partial view of a piezoelectric element constructed according to the present invention for measuring acceleration in three directions X, Y, Z of coordinates arranged at right-angles to each other, in which the compression form member serves as a seismic mass.

FIG. 7 shows a further variation of the piezoelectric transducer element according to the invention. In place of the arrangements illustrated in FIGS. 1 and 5, in which all the piezoelectric plates are sensitive to shearing forces in the axial or Z-direction of the transducer and where corresponding electrodes and connecting means are provided for adding the individual plate signals, other aims are pursued in FIG. 7. In the example illustrated, only two Z piezoelectric plates 6 bearing on the bearing surfaces 10, symmetrically with respect to the support 3, are provided, whereas two further plates 60, which are likewise designed for shearing stress, are arranged turned through 90°, so that they respond to forces in the X-direction.

Furthermore, two further plates 61 are provided, which respond to pressure at right-angles to the surface of the plate. The electrodes and insulator plates necessary for such an arrangement of plates are known to a person skilled in the art. After the assembly of this arrangement, as described above, an acceleration transducer exists, which is sensitive along the three orthogonal axes X, Y, Z with respect to the transducer and accordingly comprises three separate signal outputs. The latter, as well as the output electrodes, shielding and insulators are not shown in FIG. 7, since their arrangement is known to a person skilled in the art.

The piezoelectric transducer element according to the invention, which manages without screws and without any adhesive, nevertheless achieves extremely high surface tensions, and thus provides new possibilities in the construction of piezoelectric measuring transducers. The simple symmetrical shape together with known machining methods facilitates the creation of high precision piezoelectric elements, which can be incorporated in an optimum manner for various applications. Serving as a basis is a compression column having a single axis, consisting respectively of two symmetrical piezoelectric arrangements and which is under high tension, which is completely incorporated in a disc-shaped compression form member 5. This compression form member 5 serves two purposes: firstly, the provision of internal piezoelectric tension; secondly, when used in pressure and force transducers, for transmitting force and mounting, and in the case of acceleration transducers, as a seismic mass. When used as a seismic mass, it may consist of an alloyed steel or of a heavy metal alloy. The bore 9 should be dimensioned accordingly, since a heavy metal alloy is substantially more rigid and has substantially less expansion than known Ni or Fe alloys. Matching of the elasticity and coefficient of expansion of the piezoelectric support 3, piezoelectric plates 6 and pressure distribution members 4 to those of the compression form member 5 and if necessary to the shrunk-on ring 50 takes place by calculation and experimentation, in particular as regards the necessary shrinkage allowance, in this case, the diameter d of the bore 9 thus plays an important role.

Applications of the transducer element according to the present invention are a pressure-transducer and acceleration transducer. Use in a force transducer is possible in a similar manner. Variations where the piezoelectric element is provided in a simple manner in transducers whose bases are insulated or provided with a Faraday cage are also described herein.

Starting from a basic concept and according to the principle of combination and optimization, the present invention provides a series of different possibilities which are new from the application point of view.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A piezoelectric element for incorporation in pressure, force or acceleration transducers comprising at least two piezoelectric flat plates loaded in shear mode and arranged on both sides of a central support means, the at least two piezoelectric flat plates being retained under compressive pre-tension by pressure distribution members bearing externally on the piezoelectric plates, and a substantially stiff spring-like compression means for applying forces to the subassembly consisting of the support means, piezoelectric plates and pressure distribution members, the compression means including a compression form member having a non-circular slot disposed therein for receiving and retaining therein the subassembly, the compression form member being tightly fitted over the pressure distribution members.

2. A piezoelectric element according to claim 1, wherein the compression form member is a substantially solid shrunk-fitted member.

3. A piezoelectric element according to claim 1, wherein the compression means further includes a ring tightly fitted over the compression form member, the compression form member being a substantially solid member and further including an expansion slot therein.

4. A piezoelectric element according to claim 3, wherein the ring is a shrunk-fitted ring extending over the compression form member.

5. A piezoelectric element according to claims 1 or 3, wherein the non-circular slot in the compression form member has a rectangular section tangentially adjoining opposite ends of which are sections in the form of a part of a circle, which have a curvature adapted to the pressure distribution members in the form of a circular segment.

6. A piezoelectric element according to claim 5, wherein the pressure distribution members are made of two exact fitting cylindrical segments transmitting high tension forces substantially evenly over the piezoelectric plates and have diametrically opposed flattened parallel regions, the non-circular slot extending substantially in co-extension and centrally with respect to a main axis of the compression form member.

7. A piezoelectric element according to claim 5, wherein the compression form member has a circular cross-section.

8. A piezoelectric element for incorporation in pressure, force or acceleration transducers, with at least two piezoelectric flat plates loaded in shear mode, which are arranged on both sides of a central support means and are retained under compressive pre-tension by pressure distribution members bearing externally on the piezoelectric plates, characterized by a solid and substantially stiff spring-shaped compression form member provided with a location opening for the arrangement consisting of the support means, piezoelectric plates and pressure distribution members, said compression form member being tightly fitted by shrinking over the pressure distribution members, and the compression member including an expansion slot and being fitted by shrinking on the pressure distribution members by means of a shrunk-on ring.

9. A piezoelectric element for incorporation in pressure, force or acceleration transducers, with at least two piezoelectric flat plates loaded in shear mode, which are arranged on both sides of a central support means and are retained under compressive pre-tension by pressure distribution members bearing externally on the piezoelectric plates, characterized by a solid and substantially stiff spring-shaped compression form member provided with a location opening for the arrangement consisting of the support means, piezoelectric plates and pressure distribution members, said compression form member being tightly fitted by shrinking over the pressure distribution members, and the support means being a rectangular block with a central bore whose diameter is predetermined to achieve an optimum adaptation of elasticity.

10. A piezoelectric element for incorporation in pressure, force or acceleration transducers, with an arrangement of piezoelectric flat plates loaded in shear mode, which are arranged on both sides of a central support means and are retained under compressive pre-tension by pressure distribution members bearing externally on the piezoelectric plates, characterized by a solid and substantially stiff spring-shaped compression form member provided with a location opening for the arrangement consisting of the support means, piezoelectric plates and pressure distribution members, said compression form member being tightly fitted by shrinking over the pressure distribution members, the arrangement of piezoelectric plates consisting of at least one piezoelectric plate on each side of the support means with a response sensitivity in the shearing direction and one piezoelectric plate with a response sensitivity in a direction at right angle thereto, the piezoelectric plates being interconnected electrically with the interposition of electrodes so that acceleration forces can be measured in the directions of two coordinates at right angle to each other.

11. A piezoelectric element for incorporation in pressure, force or acceleration transducers, with at least two piezoelectric flat plates loaded in shear mode, which are arranged on both sides of a central support means and are retained under compressive pre-tension by pressure distrubution members bearing externally on the piezoelectric plates, characterized by a solid and substantially stiff spring-shaped compression form member provided with a location opening for the arrangement consisting of the support means, piezoelectric plates and pressure distribution members, said compression form member being tightly fitted by shrinking over the pressure distribution members, the location hole in the compression form member having a rectangular section tangentially adjoining ends of which are sections in the form of part of a circle, which have a curvature adapted to the pressure distribution members in the form of a circular segment.

12. A piezoelectric element according to claim 9, characterized in that a press-fit piston is provided on the support means.

13. A piezoelectric element according to claim 9, characterized in that formed between the support means and press-fit piston is an enlarged peripheral flange, to which a shielding hood for the electrical shielding of the arrangement consisting of the compression form member, the pressure distribution members, the piezoelectric plates and support means, can be attached.

14. A piezoelectric element according to claim 9, characterized in that the compression form member consists of a heavy metal alloy.

15. A piezoelectric element according to claim 10, characterized by providing at least one further piezoelectric plate on each side of the support with a response sensitivity in a direction (Y) at right angles to the two aforementioned directions, for measuring acceleration forces in three directions (X, Y, Z) of coordinates at right angles to each other.

16. A piezoelectric element according to claim 11, characterized in that the pressure distribution members have diametrically opposed flattened parallel regions and that the location hole extends substantially in co-extension and centrally with respect to a main axis of the compression form member.

17. A piezoelectric element according to claim 11, characterized in that the compression form member has a circular cross section.

* * * * *